United States Patent
Chiu et al.

(10) Patent No.: US 10,319,713 B2
(45) Date of Patent: Jun. 11, 2019

(54) SEMICONDUCTOR DEVICES WITH ELECTROSTATIC DISCHARGE ROBUSTNESS

(71) Applicant: Leadtrend Technology Corporation, Zhubei, Hsinchu County (TW)

(72) Inventors: Kuo-Chin Chiu, Zhubei (TW); Chia-Wei Hung, Zhubei (TW)

(73) Assignee: LEADTREND TECHNOLOGY CORPORATION, Zhubei, Hsinchu County (TW)

(*) Notice: Subject to any disclaimer, the term of this patent is extended or adjusted under 35 U.S.C. 154(b) by 0 days.

(21) Appl. No.: 15/868,592

(22) Filed: Jan. 11, 2018

(65) Prior Publication Data

US 2018/0211950 A1 Jul. 26, 2018

(30) Foreign Application Priority Data

Jan. 20, 2017 (TW) .............................. 106102123 A

(51) Int. Cl.
| | |
|---|---|
| *H01L 27/02* | (2006.01) |
| *H01L 27/06* | (2006.01) |
| *H02H 9/04* | (2006.01) |
| *H01L 29/06* | (2006.01) |
| *H01L 29/78* | (2006.01) |

(Continued)

(52) U.S. Cl.
CPC ...... *H01L 27/0262* (2013.01); *H01L 27/0255* (2013.01); *H01L 27/0266* (2013.01); *H01L 27/0288* (2013.01); *H01L 27/0292* (2013.01); *H01L 27/0635* (2013.01); *H01L 29/0692* (2013.01); *H02H 9/046* (2013.01); *H01L 29/0649* (2013.01); *H01L 29/1095* (2013.01); *H01L 29/735* (2013.01); *H01L 29/7816* (2013.01)

(58) Field of Classification Search
CPC ............ H01L 27/0262; H01L 27/0255; H01L 27/0266; H01L 27/0288; H01L 27/0292; H01L 27/0635; H01L 29/0692; H01L 29/0649; H01L 29/1095; H01L 29/7816; H02H 9/046
See application file for complete search history.

(56) References Cited

U.S. PATENT DOCUMENTS

| | | | | |
|---|---|---|---|---|
| 9,209,169 B1* | 12/2015 | Lee | ..................... | H01L 29/7816 |
| 9,224,859 B1* | 12/2015 | Pu | ....................... | H01L 29/1095 |
| 2012/0175673 A1* | 7/2012 | Lee | ..................... | H01L 27/0277 |
| | | | | 257/140 |

* cited by examiner

*Primary Examiner* — Sitaramarao S Yechuri
(74) *Attorney, Agent, or Firm* — McClure, Qualey & Rodack, LLP

(57) ABSTRACT

An embodiment provides a semiconductor device integrated with a switch device and an ESD protection device, having electrostatic discharge robustness. Formed on a semiconductor substrate of a first type is a drain region of a second type opposite to the first type. The switch device has a source region of the second type, formed on the semiconductor substrate and with a first arch portion facing inwardly toward a first direction. The first arch portion partially surrounds the drain region. A control gate of the switch device controls electric connection between the drain region and the source region. The ESD protection device comprises a first region and a second region, both of the first type. The first region adjoins the drain region. The second region has a second arch portion facing inwardly toward a second direction opposite to the first direction, and the second arch portion partially surrounds the first region.

14 Claims, 5 Drawing Sheets

(51) Int. Cl.
*H01L 29/10* (2006.01)
*H01L 29/735* (2006.01)

SEMICONDUCTOR DEVICES WITH ELECTROSTATIC DISCHARGE ROBUSTNESS

CROSS-REFERENCE TO RELATED APPLICATION

This application claims priority to and the benefit of Taiwan Application Series Number 106102123 filed on Jan. 20, 2017, which is incorporated by reference in its entirety.

BACKGROUND

The present disclosure relates generally to high-voltage switch devices with electrostatic discharge (ESD) robustness, and more particularly to high-voltage switch devices integrated with at least one ESD protection device to improve their ESD robustness.

A high-voltage metal-oxide-semiconductor field effect transistor (MOSFET) refers normally to a MOSFET capable of sustaining a drain-to-source voltage higher than 5 volt. It can be used for load switch, voltage conversion in power management, or power amplification.

If a high-voltage MOSFET is configured to receive a high voltage from a resource external to the semiconductor chip in which the high-voltage MOS transistor is formed, the high-voltage MOS transistor should be equipped with electrostatic discharge (ESD) protection so it can withstand ESD stress caused by its external environment. ESD robustness of a device often refers to the highest ESD stress that the device can withstand without damage. A high-voltage MOSFET usually has very weak ESD robustness, substantially due to non-uniformity of electric field distribution and local current crowding effect at a discontinuous region inside the high-voltage MOSFET.

A well-known solution to improve ESD robustness of a device is to enlarge the device's size, because the maximum electric field and the current crowding effect inside the device might be reduced. Size enlargement to a high-voltage MOSFET is sometimes unfavorable, however. A high-voltage MOSFET is normally huge in size, in order to sustain high-voltage input and to provide desired driving ability. Making a huge device larger additionally requires enormous silicon area and could become less cost-effective.

BRIEF DESCRIPTION OF THE DRAWINGS

Non-limiting and non-exhaustive embodiments of the present invention are described with reference to the following drawings. In the drawings, like reference numerals refer to like parts throughout the various figures unless otherwise specified. These drawings are not necessarily drawn to scale. Likewise, the relative sizes of elements illustrated by the drawings may differ from the relative sizes depicted.

The invention can be more fully understood by the subsequent detailed description and examples with references made to the accompanying drawings, wherein.

DETAILED DESCRIPTION

One embodiment of the invention provides a high-voltage MOSFET integrated with an ESD protection device. The high-voltage MOSFET has a high-voltage switch device and the ESD protection device. The high-voltage switch device comprises a heavily-doped drain region and several first doped regions. The first doped regions, in the form of strips, are formed in a first racetrack pattern to partially surround the heavily-doped drain region. These first doped regions form an arch portion facing inward to the heavily-doped drain region. The ESD protection device comprises a first heavily-doped region and several second doped regions. The second doped regions, also in the form of strips, are formed in a second racetrack pattern to partially surround the first heavily-doped region. These second doped regions form another arch portion facing inward to the first heavily-doped region. The heavily-doped drain region and the first heavily-doped region together are electrically connected to a pad.

When an ESD event occurs at the pad, in comparison with the high-voltage switch device, the ESD protection device could provide quicker ESD triggering and smoother electric field distribution. Therefore, it is possible for the high-voltage MOSFET to have excellent ESD robustness.

Figure 1:
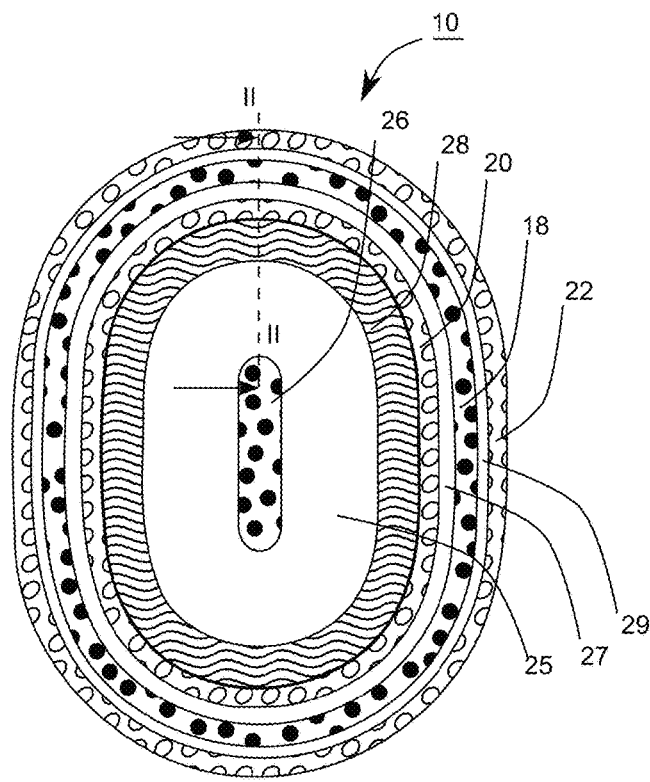
FIG. 1 demonstrates a top view of high-voltage MOSFET 10.
Figure 2:
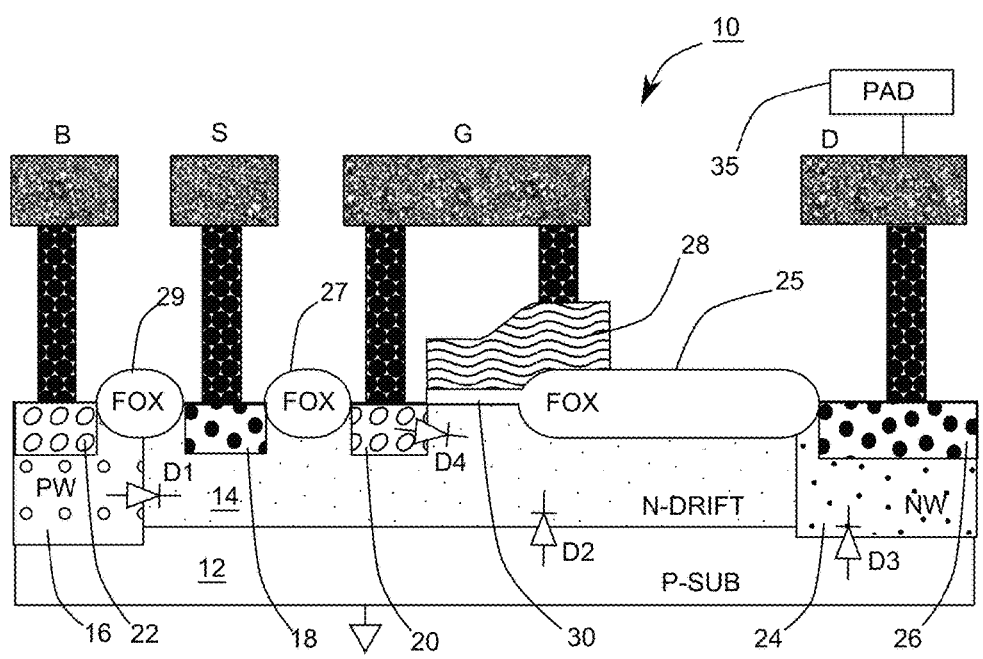
FIG. 2 is a cross-sectional view of high-voltage MOSFET 10 generated by a plane cutting through line II-II in FIG. 1.

FIG. 1 demonstrates a top view of high-voltage MOSFET 10, and FIG. 2 a cross-sectional view of high-voltage MOSFET 10 generated by a plane cutting through line II-II in FIG. 1.

In FIG. 1, high-voltage MOSFET 10 has, from its inside to its outside, N-type heavily-doped drain region 26, field oxide region 25, conductive gate 28, P-type heavily-doped region 20, field oxide region 27, N-type heavily-doped source region 18, field oxide region 29, and P-type heavily-doped region 22. P-type heavily-doped region 20, N-type heavily-doped source region 18, and P-type heavily-doped region 22 are in the form of round strips, and they are formed in a racetrack pattern to completely surround N-type heavily-doped drain region 26. A racetrack pattern refers to a pattern with strips or tracks that extend in parallel to one another and do not go across each other if bended. That race track pattern could uniform electric field distribution in high-voltage MOSFET 10, equipping it with good ESD robustness.

All the P-type heavily-doped regions, including P-type heavily-doped region 20, could be formed at the same time by way of the same manufacturing processes, so they could be of the same impurity concentration. Similarly, all the N-type heavily-doped regions, including N-type heavily-doped drain region 26 and N-type heavily-doped source region 18, could be of the same impurity concentration. In the embodiments of the invention detailed in this specification, all the P-type heavily-doped regions have a common impurity concentration, and all the N-type heavily-doped regions have another common impurity concentration.

As demonstrated in FIG. 2, high-voltage MOSFET 10 has a P-type substrate 12. N-type heavily-doped drain region 26 is formed on N-type well region 24, which is formed on P-type substrate 12. P-type heavily-doped region 22 is formed on P-type well region 16, which is also formed on P-type substrate 12. Between P-type well region 16 and N-type well region 24 is N-type drift region 14, on which N-type heavily-doped source region 18 and P-type heavily-doped region 20 are formed. Gate oxide layer 30 extends from field oxide region 25, having an edge substantially aligning with a boundary of P-type heavily-doped region 20. Conductive gate 28 has conductive gate material over gate oxide layer 30 and field oxide region 25.

N-type heavily-doped drain region 26 is electrically connected to pad 35 via a metal layer and at least one ohmic contact, acting as a drain electrode D. P-type heavily-doped region 20 and conductive gate 28 short to each other to act as a gate electrode G. N-type heavily-doped source region 18 is electrically connected via an ohmic contact to a metal layer to be source electrode S. P-type substrate 12, P-type well region 16, and P-type heavily-doped region 22 all short to a ground line, and the metal layer shorting to P-type heavily-doped region 22 via an ohmic contact is a body electrode B.

Figure 3:
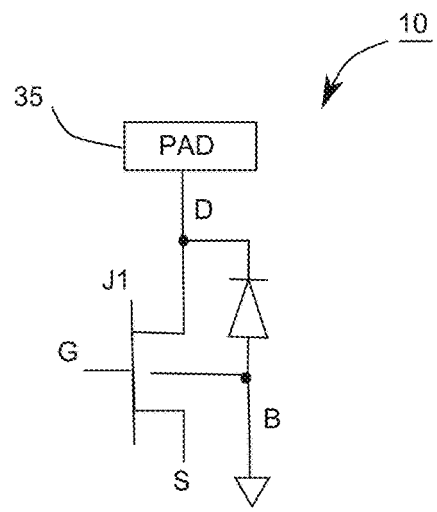
FIG. 3 shows the equivalent circuit of high-voltage MOSFET 10 in FIG. 2.

Derivable from semiconductor physics, high-voltage MOSFET 10 could be a depletion-mode junction effect transistor (JFET), and FIG. 3 shows the equivalent circuit of high-voltage MOSFET 10 in FIG. 2. JFET J1 in FIG. 3 could be used for high-voltage startup, by connecting pad 35 to a voltage as high as 300 volts for example, gate electrode G to a ground line, and source electrode S to an operating voltage source capacitor providing operating voltage $V_{CC}$. In other words, JFET J1 could be a high-voltage switch device.

In conditions when both gate voltage $V_G$ at gate electrode G and source voltage $V_S$ at source electrode S are about 0 volt, JFET J1 is ON, capable of conducting current from drain electrode D to charge the operating voltage source capacitor connected to source electrode S. As the charging proceeds, operating voltage $V_{CC}$ rises and so does source voltage $V_S$. When gate-to-source voltage $V_{GS}$, equal to gate voltage $V_G$ minus source voltage $V_S$, is negative enough, the conductive channel inside JFET J1 disappears due to pinch-off, and JFET J1 is turned OFF to stop charging the operating voltage source capacitor. The gate electrode G is seemingly a control gate, where gate-to-source voltage $V_{GS}$ controls the electric connection between N-type heavily-doped drain region 26 and N-type heavily-doped source region 18.

The ESD robustness of high-voltage MOSFET 10 might not good enough, however. When an ESD stress occurs at pad 35, it can be only released through the breakdown of diodes connected between drain electrode D and body electrode B. FIG. 2 shows four diodes D1, D2, D3 and D4, all parasitic inside high-voltage MOSFET 10, where diode D1 represents the junction between P-type well region 16 and N-type drift region 14, diode D2 the junction between P-type substrate 12 and N-type drift region 14, diode D3 the junction between P-type substrate 12 and N-type well region 24, and diode D4 the junction between P-type heavily-doped region 20 and N-type drift region 14. Because of impurity concentration difference, diode D4 has the least breakdown voltage among the four diodes. It implies that most of ESD discharge current will go through diode D4 when an ESD event happens at pad 35. Local current crowding effect could easily happen to diode D4 and burn it down, making ESD robustness of high-voltage MOSFET 10 not good.

Figure 4:
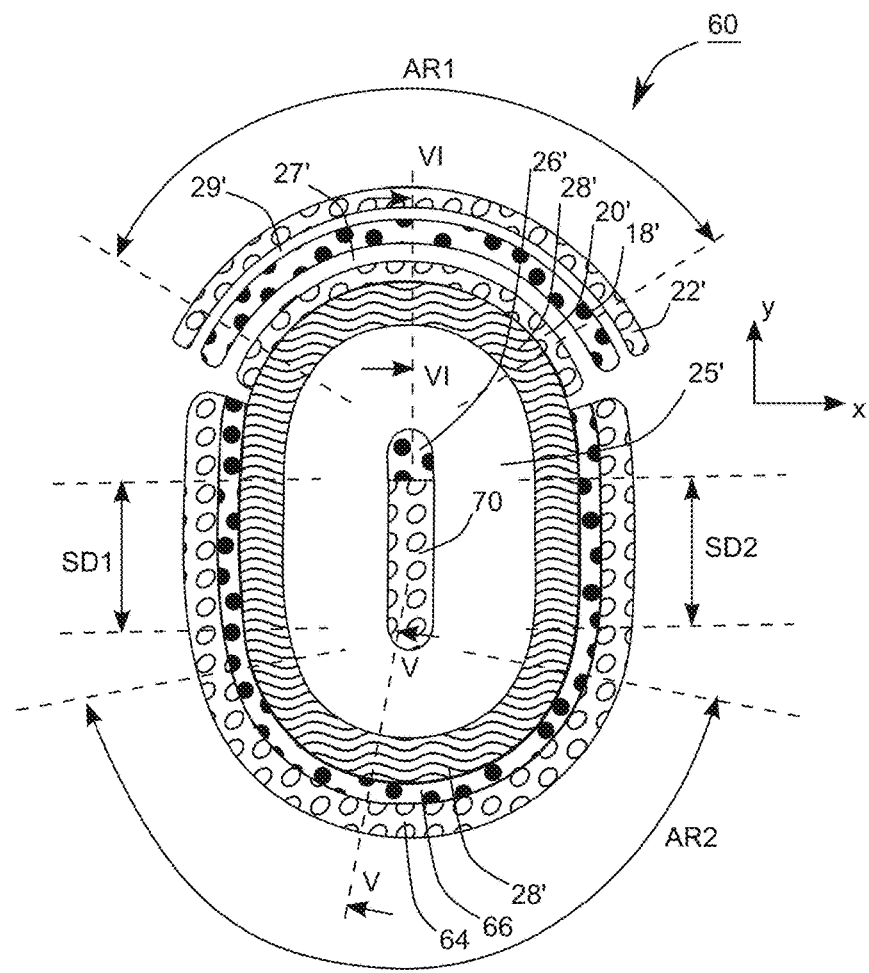
FIG. 4 demonstrates a top view of high-voltage MOSFET 60 according to embodiments of the invention.
Figure 5:
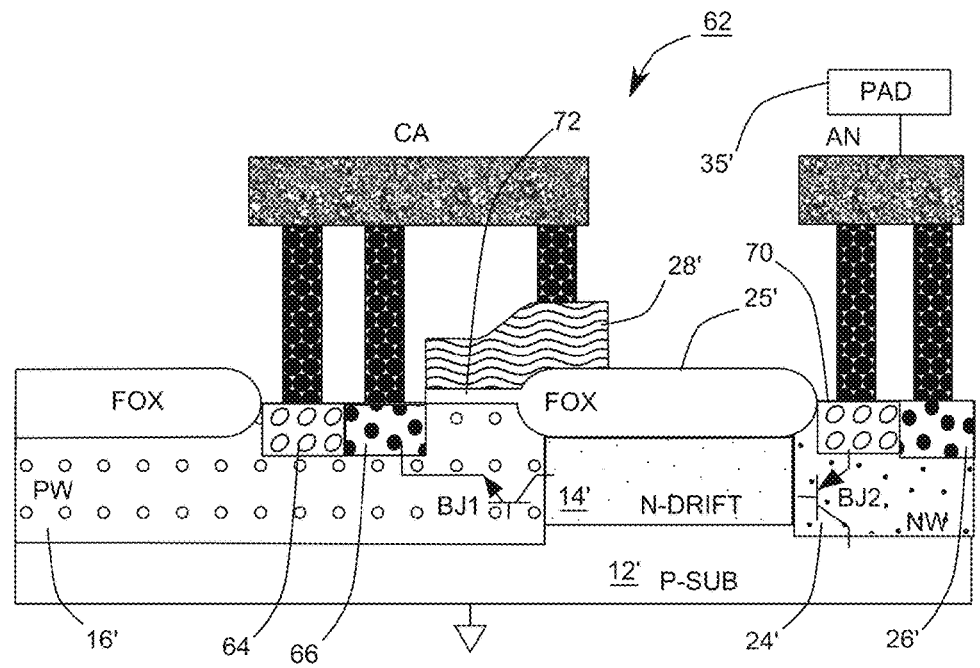
FIG. 5 is a cross-sectional view of high-voltage MOSFET 60, generated by a plane cutting through line V-V in FIG. 4.
Figure 6:
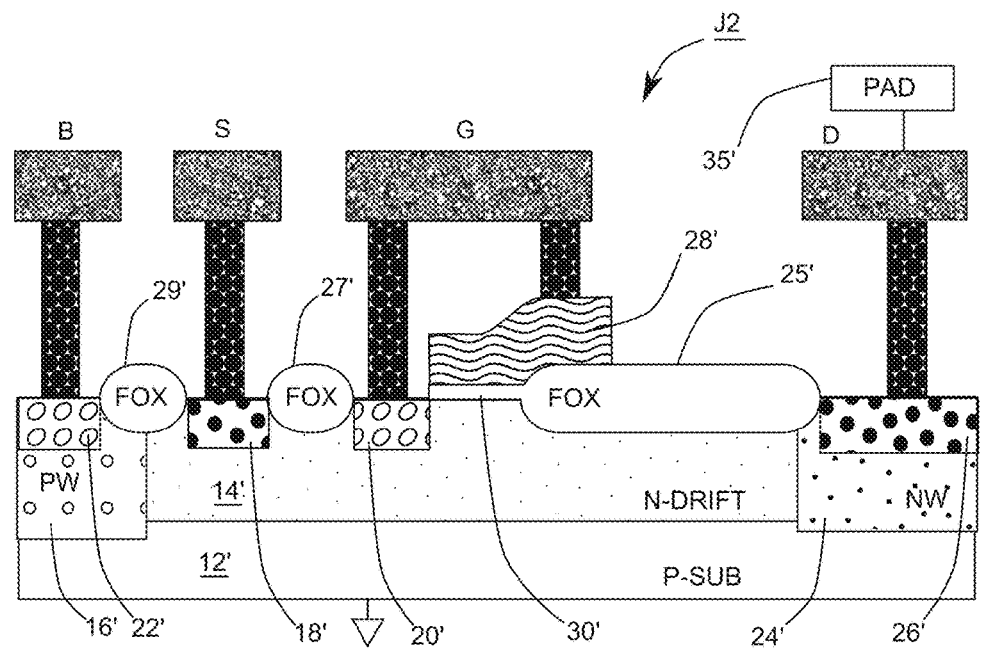
FIG. 6 is another cross-sectional view of high-voltage MOSFET 60, generated by a plane cutting through line VI-VI in FIG. 4.
Figure 7:
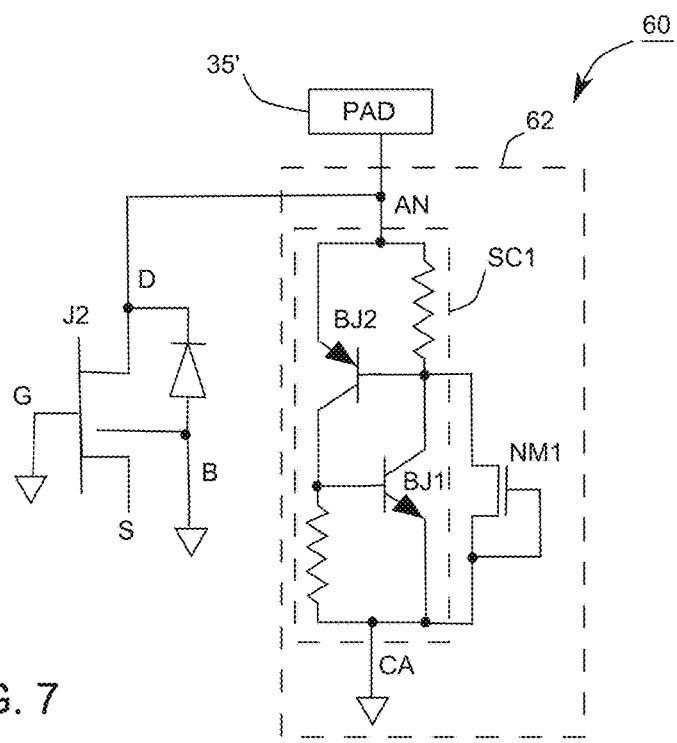
FIG. 7 is an equivalent circuit of high-voltage MOSFET 60.

FIG. 4 demonstrates a top view of high-voltage MOSFET 60 according to embodiments of the invention. FIG. 5 is a cross-sectional view of high-voltage MOSFET 60, generated by a plane cutting through line V-V in FIG. 4. FIG. 6 is another cross-sectional view of high-voltage MOSFET 60, generated by a plane cutting through line VI-VI in FIG. 4. FIG. 7 is an equivalent circuit of high-voltage MOSFET 60.

High-voltage MOSFET 60 in FIG. 4 has an upper portion similar with high-voltage MOSFET 10 in FIG. 1, and the similarity is also evidenced by that FIGS. 6 and 2 differ only in symbols. Accordingly, as shown in FIG. 7, high-voltage MOSFET 60 includes JFET J2, whose features can be known byway of the aforementioned teaching regarding to high-voltage MOSFET 10.

The center of high-voltage MOSFET 60 in FIG. 4 has not only N-type heavily-doped drain region 26' but also P-type heavily-doped region 70.

The lower portion of high-voltage MOSFET 60 in FIG. 4 differs with FIG. 1, and it represents an ESD protection device 62, whose cross-sectional view is shown in FIG. 5 and whose equivalent circuit is demonstrated in the right half of FIG. 7. ESD protection device 62 will be detailed later.

Please refer to FIGS. 4 and 6. In JFET J2, P-type heavily-doped region 20', N-type heavily-doped source region 18' and P-type heavily-doped region 22' are in the form of curved strips, and they are formed in a racetrack pattern to partially surround N-type heavily-doped drain region 26'. Like the tracks in a racetrack, P-type heavily-doped region 20', N-type heavily-doped source region 18' and P-type heavily-doped region 22' extend substantially in parallel and do not go across one another when bended. If the line VI-VI moves along the direct that the tracks in FIG. 4 extend to, the cross-sectional view generated correspondingly should be the same or the similar with what is shown in FIG. 6. P-type heavily-doped region 20', N-type heavily-doped source region 18' and P-type heavily-doped region 22' together have arc portion AR1 shown in FIG. 4, which partially surrounds N-type heavily-doped drain region 26'. Arc portion AR1 faces inwardly toward the negative direction of y axis, or it has an opening facing to the negative direction of y axis.

As shown in FIG. 4, P-type heavily-doped region 22' partially surrounds N-type heavily-doped source region 18' and faces inwardly toward the negative direction of y axis. In FIG. 4, P-type heavily-doped region 22' substantially encloses the outer side of N-type heavily-doped source region 18', which substantially encloses the outer side of P-type heavily-doped region 20'.

Please refer to FIGS. 4 and 5. P-type heavily-doped region 64 and N-type heavily-doped region 66 are also in the form of curved strips, formed in another racetrack pattern to partially surround P-type heavily-doped region 70. P-type heavily-doped region 64 and N-type heavily-doped region 66 together form arc portion AR2 shown in FIG. 4, which partially surrounds P-type heavily-doped region 70 in the center. Arc portion AR2 faces inwardly toward the positive direction of y axis, or it has an opening facing to the positive direction of y axis. In FIG. 4, the directions that the openings of arc portions AR1 and AR2 face to respectively are aligned to each other, but this invention is not limited to. In some other embodiments of the invention, the directions that the openings of arc portions AR1 and AR2 face to are opposite to each other, but they are not aligned to a straight line.

P-type heavily-doped region 64 and N-type heavily-doped region 66 in FIG. 4 also form two straight wall portions SD1 and SD2 positioned at two opposite sides of P-type heavily-doped region 70.

Shown in FIG. 5, ESD protection device 62 has P-type substrate 12'. N-type heavily-doped drain region 26' adjoins P-type heavily-doped region 70, both inside N-type well region 24' on P-type substrate 12'. In another embodiment of the invention, N-type heavily-doped drain region 26' does not adjoin P-type heavily-doped region 70, even though they both are inside N-type well region 24'. P-type heavily-doped region 64 and N-type heavily-doped region 66 both are in P-type well region 16' on P-type substrate 12', and they could optionally adjoin to or separate from each other. Between N-type well region 24' and P-type well region 16' is N-type drift region 14'. N-type drift region 14' completely encloses N-type well region 24' in a top view of high-voltage MOSFET 60, even though FIG. 4 does not show this feature. Gate oxide layer 72 extends from field oxide region 25', and has an edge substantially aligning with a boundary of N-type heavily-doped region 66. Conductive gate 28' has conductive gate material over gate oxide layer 72 and field oxide region 25', and gate oxide layer 72 is positioned between P-type well region 16' and conductive gate 28'.

Both N-type heavily-doped drain region 26' and P-type heavily-doped region 70 electrically connect to a metal layer via at least one ohmic contact, acting as anode AN electrically connected to pad 35'. P-type heavily-doped region 64, N-type heavily-doped region 66, and conductive gate 28' electrically connect to one another via a metal layer and at least one ohmic contact, acting as cathode CA connected to a ground line.

P-type heavily-doped region 70, N-type well region 24' and P-type substrate 12' compose a PNP bipolar junction transistor (BJT) BJ2, while N-type drift region 14', P-type well region 16' and N-type heavily-doped region 66 compose a NPN BJT BJ1. Conductive gate 28', gate oxide layer 72, N-type drift region 14', P-type well region 16' and N-type heavily-doped region 66 together could form an enhancement-mode N-type MOSFET NM1. As shown in FIG. 7, BJT BJ1, BJT BJ2 and parasitic resistors can compose a silicon-controlled rectifier (SCR) SC1, where the drain and source electrodes of N-type MOSFET NM1 are connected to the collector and emitter of NPN BJT BJ1 respectively. Whenever a junction in NPN BJT BJ1 and PNP BJT BJ2 breaks down, SCR SC1 provides a positive feedback to make both NPN BJT BJ1 and PNP BJT BJ2 ON, conducting large current or releasing stress. When no junctions in NPN BJT BJ1 and PNP BJT BJ2 break down, NPN BJT BJ1 and PNP BJT BJ2 possibly remain OFF, acting as an open circuit.

In practice, the triggering voltage to turn ON SCR SC1 is preferably configured to be lower than the breakdown voltage of JFET J2, so SCR SC1 starts releasing ESD stress, if happening, earlier than JFET J2 does. SCR SC1 could have better ESD robustness than JFET J2 because, unlike JFET J2 with only one discharge path, SCR SC1 has at least two discharge paths to release ESD stress. One discharge path in SCR SC1 goes laterally through NPN BJT BJ1, and the other vertically through PNP BJT BJ2. Therefore, the distribution of ESD discharge current is smoother, and the likelihood of local current crowding is less.

Conductive gate 28' could beneficially act as a field plate to improve the electric field distribution inside N-type drift region 14'. Besides, conductive gate 28' could further help reducing the triggering voltage of SCR SC1, so SCR SC1 could respond faster to release ESD stress when an ESD event occurs.

According to some embodiments of the invention, ESD protection device 62 might lack conductive gate 28' and gate oxide layer 72, or ESD protection device 62 might lack N-type MOSFET NM1.

This invention is not limited to having an SCR as an ESD protection device. Some embodiments of the invention might have one or several BJTs as ESD protection devices.

Figure 8:
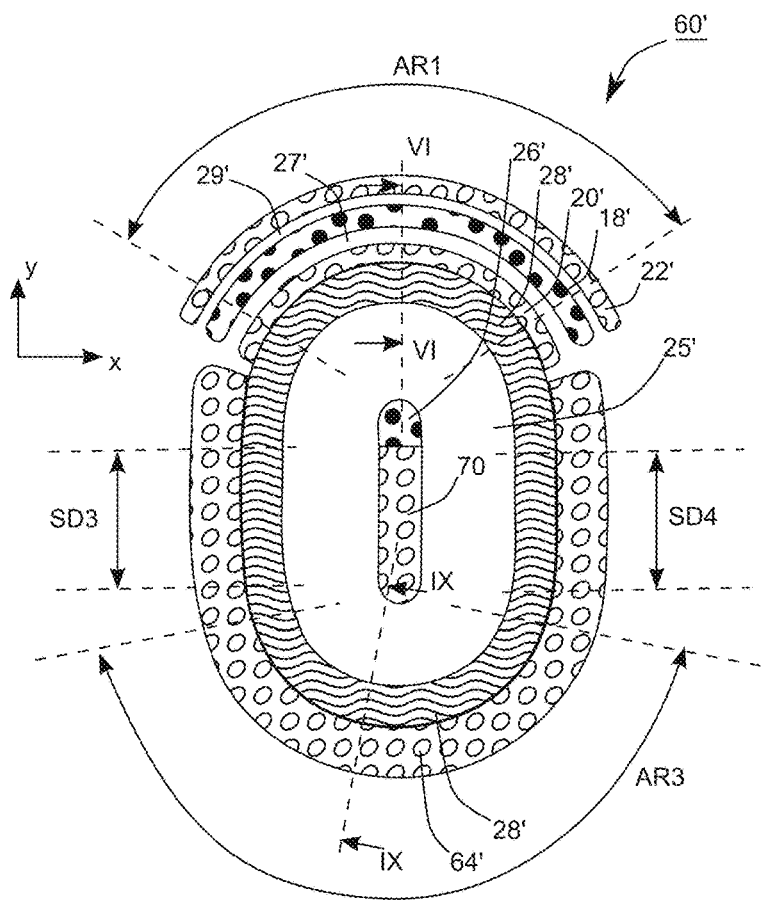
FIG. 8 demonstrates a top view of high-voltage MOSFET 60' according to embodiments of the invention.
Figure 9:
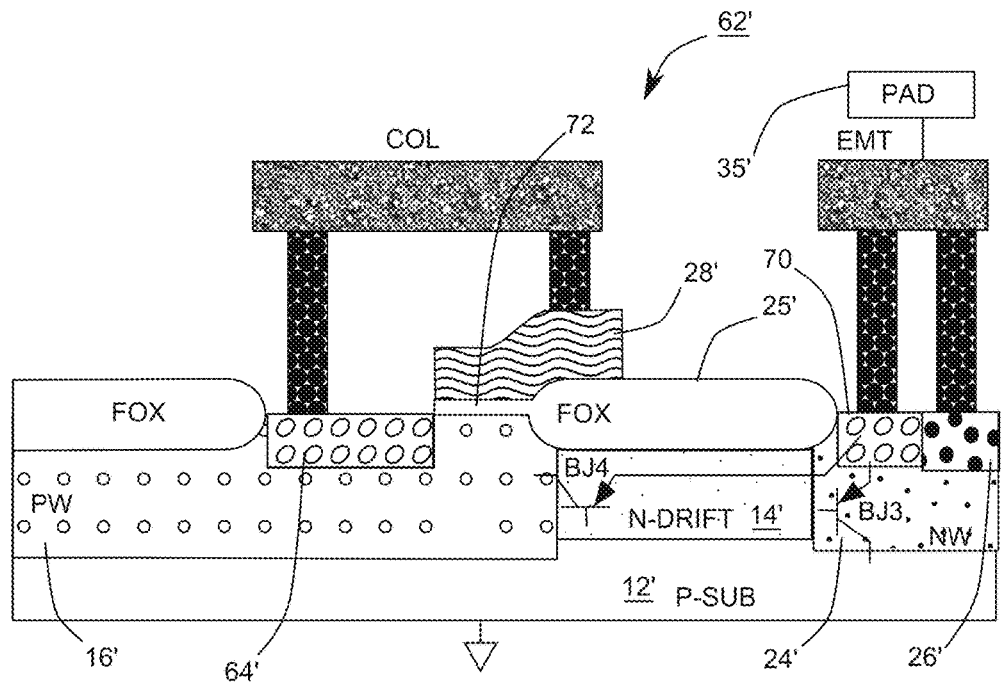
FIG. 9 is a cross-sectional view of high-voltage MOSFET 60', generated by a plane cutting through line IX-IX in FIG. 8.
Figure 10:
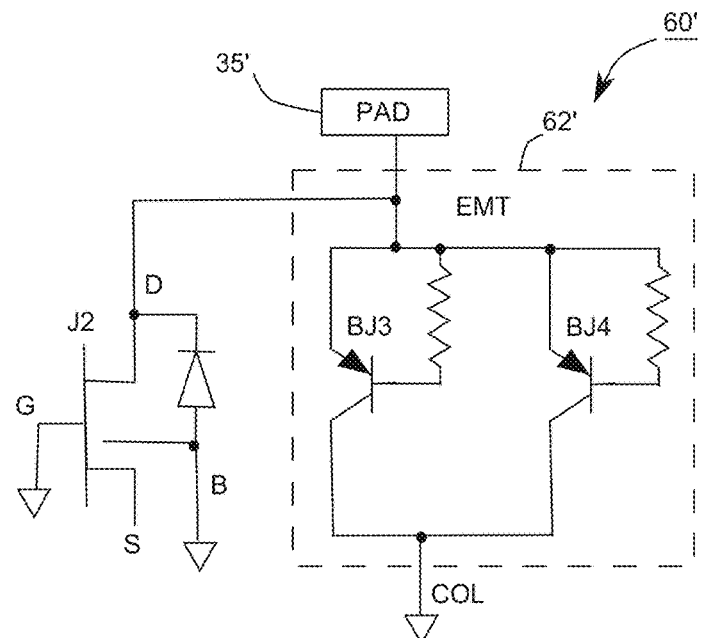
FIG. 10 is an equivalent circuit of high-voltage MOSFET 60'.

FIG. 8 demonstrates a top view of high-voltage MOSFET 60' according to embodiments of the invention. FIG. 9 is a cross-sectional view of high-voltage MOSFET 60', generated by a plane cutting through line IX-IX in FIG. 8. FIG. 9 also shows a cross-sectional view of an ESD protection device 62'. FIG. 10 is an equivalent circuit of high-voltage MOSFET 60'.

FIGS. 8, 9 and 10 are similar with FIGS. 4, 5 and 7 respectively. Some features in FIGS. 8, 9 and 10 might not be detailed for brevity as they could be learned in view of the aforementioned teachings regarding to FIGS. 4, 5 and 7.

FIG. 8 has P-type heavily-doped region 64' replacing both P-type heavily-doped region 64 and N-type heavily-doped region 66 in FIG. 4. FIG. 9 has p-type heavily-doped region 64' replacing both P-type heavily-doped region 64 and N-type heavily-doped region 66 in FIG. 5. FIG. 10 has ESD protection device 62' replacing ESD protection device 62 in FIG. 7, and ESD protection device 62' has no SCR.

In FIG. 8, P-type heavily-doped region 64' has arc portion AR3 facing inwardly toward the positive direction of y axis. Arc portion AR3, in other words, has an opening facing to the positive direction of y axis. In FIG. 8, the directions that the openings of arc portions AR1 and AR3 face to respectively are aligned to each other, but this invention is not limited to. In some embodiments of the invention, the directions that the openings of arc portions AR1 and AR3 face to are opposite to each other, but they are not aligned to a straight line.

P-type heavily-doped region 64' also has two straight wall portions SD3 and SD4 at two opposite sides of P-type heavily-doped region 70.

As shown in FIG. 9, N-type heavily-doped drain region 26' and P-type heavily-doped region 70 electrically connect to each other via a metal layer and an ohmic contact, as emitter EMT, connected to pad 35'. P-type heavily-doped region 64' and conductive gate 28' electrically connected to each other via a metal layer and an ohmic contact, as collector COL, connected to a ground line.

FIG. 9 is marked with PNP BJTs BJ3 and BJ4. PNP BJT BJ3 is a vertical BJT, substantially composed of P-type heavily-doped region 70, N-type well region 24' and P-type substrate 12'. PNP BJT BJ4 is a lateral BJT, substantially composed of P-type heavily-doped region 70, N-type drift region 14' and P-type well region 16'. The bases of PNP BJTS BJ3 and BJ4 are electrically connected to emitter EMT through the parasitic resistor within N-type drift region 14' and/or N-type heavily-doped drain region 26', while the collectors of PNP BJTS BJ3 and BJ4 electrically connect to collector COL and a ground line. The equivalent circuit of ESD protection device 62' in FIG. 9 is therefore shown in the right half of FIG. 10.

In practice, the triggering voltage to turn ON PNP BJTS BJ3 and BJ4 during an ESD event is preferably configured to be lower than the breakdown voltage of JFET J2, so PNP BJTS BJ3 and BJ4 start releasing ESD stress, if happening, earlier than JFET J2 does. ESD protection device 62' with PNP BJTS BJ3 and BJ4 could have better ESD robustness than JFET J2 alone because PNP BJTS BJ3 and BJ4 provide at least two discharge paths to release ESD stress. Therefore, the distribution of ESD discharge current in ESD protection device 62' is smoother, and the likelihood of local current crowding therein is less.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device with electrostatic discharge robustness, comprising:
    a semiconductor substrate of a first type;
    a switch device, comprising:
        a drain region formed on the semiconductor substrate, wherein the drain region is of a second type opposite to the first type;
        a source region of the second type, formed on the semiconductor substrate and with a first arch portion facing inwardly toward a first direction, wherein the first arch portion at least partially surrounds the drain region; and
        a control gate, structured to control electric connection between the drain region and the source region; and
    an ESD protection device, comprising:
        a first region of the first type formed on the semiconductor substrate; and
        a second region of the first type formed on the semiconductor substrate and with a second arch portion facing inwardly toward a second direction, wherein the second arch portion at least partially surrounds the first region;
    wherein the first direction is opposite to the second direction, and the switch device is a depletion-mode junction effect transistor.

2. The semiconductor device as claimed in claim 1, further comprising a first well region of the second type formed on the semiconductor substrate, wherein both the drain region and the first region are inside the first well region.

3. The semiconductor device as claimed in claim 2, further comprising a drift region of the second type, wherein the drift region completely surrounds the first well region, and the source region is inside the drift region.

4. The semiconductor device as claimed in claim 1, wherein the first region and the drain region are electrically connected to a pad.

5. The semiconductor device as claimed in claim 1, wherein the ESD protection device comprises a bipolar junction transistor where the first and second regions are emitter and collector of the bipolar junction transistor respectively.

6. The semiconductor device as claimed in claim 1, wherein the ESD protection device comprises a silicon controlled rectifier where the first and second regions are electrically connected to anode and cathode of the silicon controlled rectifier respectively.

7. The semiconductor device as claimed in claim 1, wherein the switch device comprises a third region of the first type, partially surrounding the source region and facing inwardly toward the first direction.

8. The semiconductor device as claimed in claim 1, wherein the first direction and the second direction are aligned to each other.

9. The semiconductor device as claimed in claim 1, wherein the second region has two wall portions positioned at two opposite sides of the first region.

10. A semiconductor device with electrostatic discharge robustness, comprising:
    a switch device, comprising:
        a drain region formed on a semiconductor substrate, wherein the semiconductor substrate is of a first type and the drain region is of a second type opposite to the first type; and
        first doped strip regions, formed in a first racetrack pattern on the semiconductor substrate to partially surround the drain region; and
    an ESD protection device formed on the semiconductor substrate, the ESD protection device comprising:
        a central region of the first type, formed on the semiconductor substrate and adjoining the drain region; and
        at least one second doped strip region, formed in a second racetrack pattern on the semiconductor substrate to partially surround the central region;
    wherein the central region and the drain region are electrically connected to a pad, the switch device is a depletion-mode junction effect transistor, and one of the first doped strip regions acts as a source electrode of the depletion-mode junction effect transistor.

11. The semiconductor device as claimed in claim 10, wherein the first doped strip regions are formed to have a first arch portion facing inwardly toward a first direction, and the second doped strip region is formed to have a second arch portion facing inwardly toward a second direction opposite to the first direction.

12. The semiconductor device as claimed in claim 10, wherein the second doped strip region has two wall portions positioned at two opposite sides of the central region.

13. The semiconductor device as claimed in claim 10, wherein the ESD protection device comprises a silicon controlled rectifier where the central and the second doped strip region are anode and cathode of the silicon controlled rectifier respectively.

14. The semiconductor device as claimed in claim 10, further comprises a drift region of the second type completely surrounding the central region and the drain region.

* * * * *